United States Patent
Shih et al.

(10) Patent No.: US 11,515,270 B2
(45) Date of Patent: Nov. 29, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yu-Lin Shih, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 104 days.

(21) Appl. No.: 17/067,561

(22) Filed: Oct. 9, 2020

(65) Prior Publication Data

US 2022/0115339 A1    Apr. 14, 2022

(51) Int. Cl.
| | |
|---|---|
| *H01L 23/66* | (2006.01) |
| *H01L 23/49* | (2006.01) |
| *H01L 23/538* | (2006.01) |
| *H01L 21/683* | (2006.01) |
| *H01L 21/48* | (2006.01) |
| *H01L 21/56* | (2006.01) |
| *H01Q 1/22* | (2006.01) |
| *H01Q 1/40* | (2006.01) |
| *H01L 23/31* | (2006.01) |

(52) U.S. Cl.
CPC .......... *H01L 23/66* (2013.01); *H01L 21/4853* (2013.01); *H01L 21/4889* (2013.01); *H01L 21/565* (2013.01); *H01L 21/568* (2013.01); *H01L 21/6835* (2013.01); *H01L 23/3128* (2013.01); *H01L 23/49* (2013.01); *H01L 23/5386* (2013.01); *H01L 23/5389* (2013.01); *H01Q 1/2283* (2013.01); *H01Q 1/40* (2013.01); *H01L 2221/68372* (2013.01); *H01L 2223/6611* (2013.01); *H01L 2223/6677* (2013.01)

(58) Field of Classification Search
CPC . H01L 23/66; H01L 21/4853; H01L 21/4889; H01L 21/565; H01L 21/568; H01L 21/6835; H01L 23/3128; H01L 23/49; H01L 23/5386; H01L 23/5389; H01L 2221/68372; H01L 2223/6611; H01L 2223/6677; H01Q 1/2283; H01Q 1/40
USPC .......................................................... 257/428
See application file for complete search history.

(56) References Cited

U.S. PATENT DOCUMENTS

| | | | |
|---|---|---|---|
| 8,199,518 B1 * | 6/2012 | Chun ................ | H01L 23/49811 361/767 |
| 8,253,259 B2 * | 8/2012 | Haba .................... | B81B 7/0006 257/784 |

(Continued)

*Primary Examiner* — Vu A Vu
(74) *Attorney, Agent, or Firm* — Foley & Lardner LLP

(57) ABSTRACT

An antenna package includes a conductive layer, an interconnection structure and an antenna. The interconnection structure is disposed on the conductive layer. The interconnection structure includes a conductive via and a first package body. The conductive via has a first surface facing the conductive layer, a second surface opposite to the first surface and a lateral surface extending from the first surface to the second surface. The first package body covers the lateral surface of the conductive via and exposes the first surface and the second surface of the conductive via. The first package body is spaced apart from the conductive layer. The antenna is electrically connected to the second surface of the conductive via.

12 Claims, 19 Drawing Sheets

(56) References Cited

U.S. PATENT DOCUMENTS

| | | |
|---|---|---|
| 9,105,616 B2 | 8/2015 | Hong et al. |
| 2019/0378801 A1* | 12/2019 | Leitgeb .................. H01L 23/66 |
| 2020/0328497 A1* | 10/2020 | Lin .................... H01L 23/5386 |

* cited by examiner

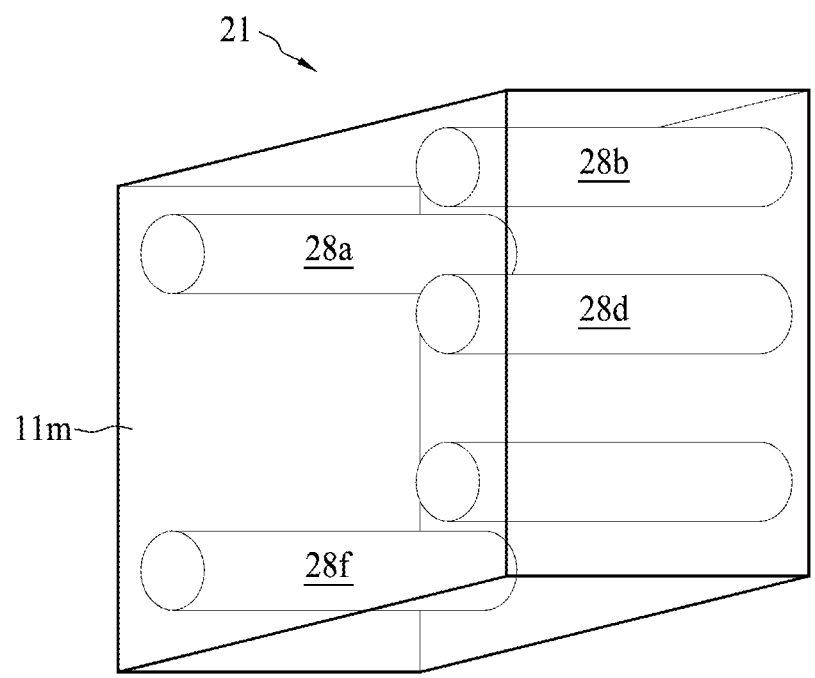
FIG. 2F"
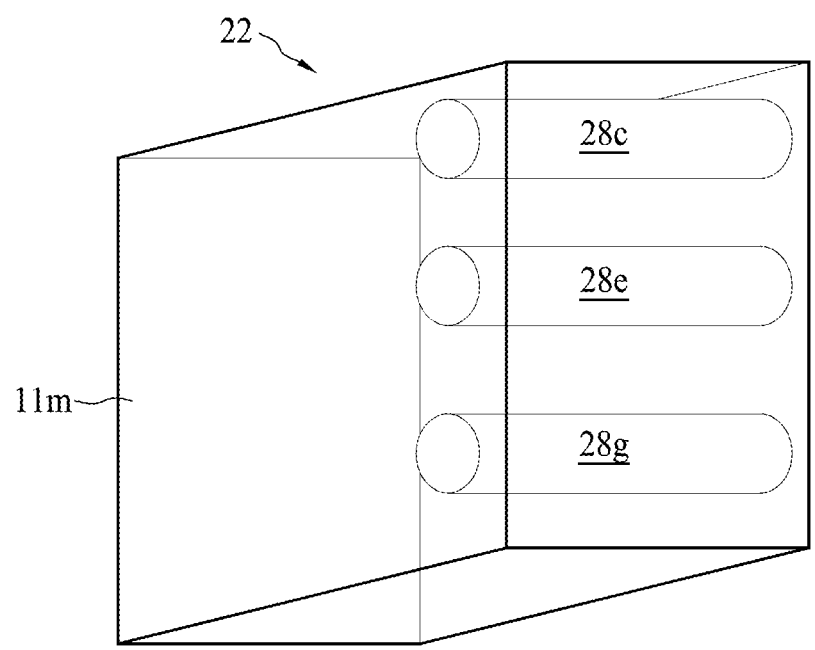
FIG. 2F'"

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an interconnection structure and a method of manufacturing the same.

2. Description of the Related Art

Wireless communication devices, such as cell phones, typically include antennas for transmitting and receiving radio frequency (RF) signals. A wireless communication device includes an antenna and a communication module disposed on a substrate. The antenna may be communicated with the communication module or the substrate through a feeding line. It is desirable to provide a feeding line to meeting the requirements for designing the wireless communication device.

SUMMARY

In accordance with some embodiments of the present disclosure, an antenna package includes a conductive layer, an interconnection structure and an antenna. The interconnection structure is disposed on the conductive layer. The interconnection structure includes a conductive via and a first package body. The conductive via has a first surface facing the conductive layer, a second surface opposite to the first surface and a lateral surface extending from the first surface to the second surface. The first package body covers the lateral surface of the conductive via and exposes the first surface and the second surface of the conductive via. The first package body is spaced apart from the conductive layer. The antenna is electrically connected to the second surface of the conductive via.

In accordance with some embodiments of the present disclosure, an antenna package includes a conductive layer, an interconnection structure, an electronic component, an encapsulant and an antenna. The interconnection structure is disposed on the conductive layer. The electronic component is disposed on the conductive layer. The encapsulant encapsulates the conductive layer, the electronic component and a first portion of the interconnection structure. The encapsulant exposes a second portion of the interconnection structure. The antenna is disposed on the interconnection structure and electrically connected the electronic component by the conductive layer.

In accordance with some embodiments of the present disclosure, a method of manufacturing an interconnection structure includes (a) providing a carrier; (b) forming a first conductive element and a second conductive element on the carrier, the first conductive element and the second conductive element include different elevations with respect to the carrier; and (c) forming a dielectric layer on the carrier and covering the first conductive element and the second conductive element.

Figure 1A:
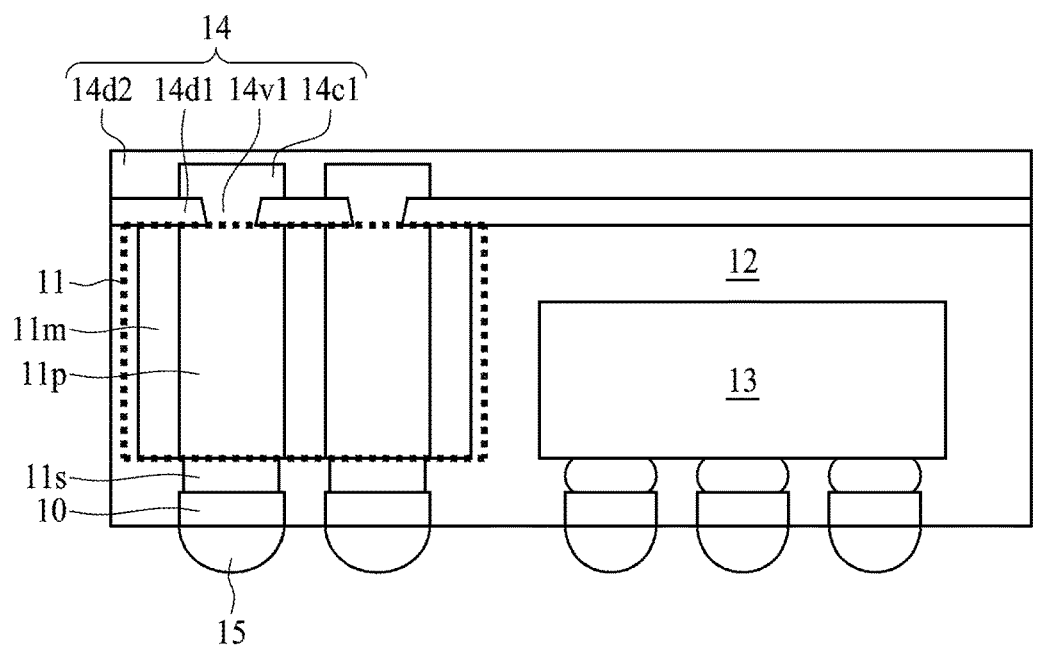
FIG. 1A illustrates a cross-sectional view of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1, in accordance with some embodiments of the present disclosure. The semiconductor device package 1 includes a conductive layer 10, an interconnection structure 11, a package body 12, an electronic component 13, a circuit layer 14 and electrical contacts 15.

The conductive layer 10 may be or include a patterned conductive layer, such as a redistribution layer (RDL). The conductive layer 10 may be or include a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The interconnection structure 11 is disposed on the conductive layer 10. The interconnection structure 11 may be electrically connected to the conductive layer 10 through electrical contacts 11s (e.g., solder). The interconnection structure 11 is configured to provide electrical connections between the conductive layer 10 and the circuit layer 14. For example, the circuit layer 14 may function as an antenna or an antenna package, and the interconnection structure 11 may function as a feeding line for the antenna. The interconnection structure 11 includes one or more conductive pins (or conductive vias) 11p and a package body 11m.

Figure 1B:
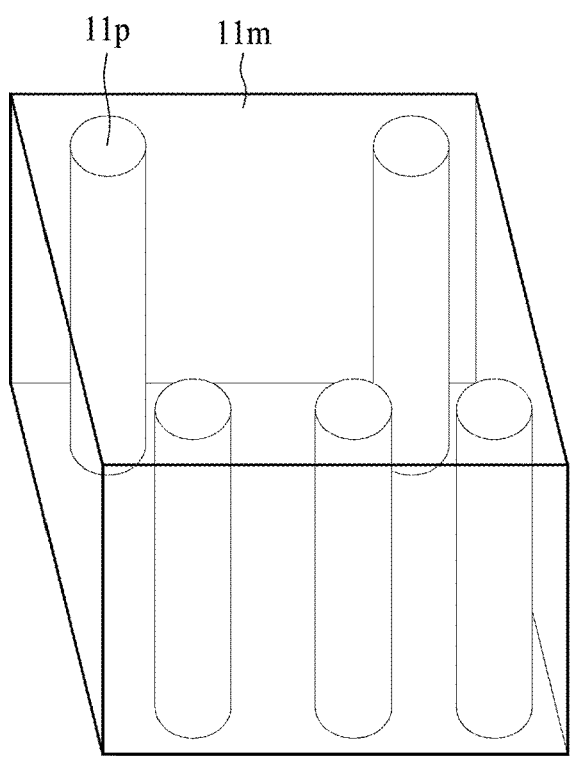
FIG. 1B illustrates a perspective view of an interconnection structure of the semiconductor device package as shown in FIG. 1A, in accordance with some embodiments of the present disclosure.

In some embodiments, the conductive pins 11p may be or include conductive wires (e.g., bonding wires). For example, the conductive pins 11p may be formed by wire-bond technique (the detailed operations will be described below). For example, each of the conductive pins 11p may be a part of a bonding wire. In some embodiments, as shown in FIG. 1B, which illustrates a perspective view of the interconnection structure 11, a top view of each of the conductive pins 11p is circular. In some embodiments, a diameter of each of the conductive pins 11p is less than 200 micrometers (μm), for example, less than 100 μm, less than 50 μm, less than 25 μm or less than 10 μm. In some embodiments, a variation of the diameters of the conductive pins 11p is less than 20%, for example, less than 15%, less than 10%, less than 5% or less than 1%. In some embodiments, a height of each of the conductive pins 11p is greater than 150 µm, for example, greater than 300 µm, greater than 500 µm or greater than 1 millimeter (mm). In some embodiments, an aspect ratio (e.g., a ratio of a height to a diameter/width) of each of the conductive pins 11p is higher than 2:1, for example, higher than 6:1.

The package body 11m surrounds and covers (encapsulates) the conductive pins 11p. The package body 11m is in contact with a lateral surface of each of the conductive pins 11p. The package body 11m exposes a top surface and a bottom surface of the conductive pins 11p for electrical connections. A top surface of the package body 11m is substantially coplanar with the top surface of the conductive pins 11p. A bottom surface of the package body 11m is substantially coplanar with the bottom surface of the conductive pins 11p. In some embodiments, the top surface (or the bottom surface) and the lateral surface of each of the conductive pins 11p have different roughness. For example, the roughness of the top surface (or the bottom surface) of each of the conductive pins 11p is greater than the lateral surface of each of the conductive pins 11p. In some embodiments, the roughness of the top surface (or the bottom surface) of each of the conductive pins 11p is less than 0.5 µm, and the roughness of the lateral surface of each of the conductive pins 11p is less than 0.1 µm.

In some embodiments, the package body 11m includes an epoxy resin including fillers, a molding compound (e.g., an epoxy molding compound or other molding compound), a polyimide, a phenolic compound or material, a material including a silicone dispersed therein, or a combination thereof. In some embodiments, the package body 11m includes a material having a dielectric constant (Dk) less than approximately 5. The package body 11m includes a material having a Dk less than approximately 3. The package body 11m includes a material having a loss tangent or dissipation factor (Df) less than approximately 0.005. The package body 11m includes a material having a loss tangent or Df less than approximately 0.003.

The electronic component 13 is disposed on the conductive layer 10. The electronic component 13 may be electrically connected to the conductive layer 10 through the electrical contacts 11s (e.g., solder). In some embodiments, the electronic component 13 may be an active component, such as an integrated circuit (IC) chip or a die. In some embodiments, the electronic component 13 may be a passive component, such as a capacitor, a resistor or an inductor. The electronic component 13 can be electrically connected to the conductive layer 10 by way of flip-chip or wire-bond techniques.

The package body 12 covers (or encapsulates) the interconnection structure 11 (including the conductive pins 11p and the package body 11m), the electronic component 13 and the conductive layer 10. A top surface of the interconnection structure 11 and a bottom surface of the conductive layer 10 are exposed from the package body 12 for electrical connections. The package body 12 is in contact with a lateral surface and the bottom surface of the package body 11m. The package body 12 exposes the top surface of the package body 11m. For example, the package body 12 has a top surface substantially coplanar with the top surface of the package body 11m.

In some embodiments, the package body 12 includes an epoxy resin including fillers, a molding compound (e.g., an epoxy molding compound or other molding compound), a polyimide, a phenolic compound or material, a material including a silicone dispersed therein, or a combination thereof. In some embodiments, the package body 12 has a coefficient of thermal expansion (CTE) similar to a CTE of the circuit layer 14, which can reduce the warpage issue caused by the CTE mismatch. In some embodiments, the package body 12 and the package body 11m include different materials. For example, the Dk of the package body 11m is lower than that of the package body 12. For example, the CTE of the package body 12 is higher than that of the package body 11m. Alternatively, the package body 12 and the package body 11m may include a same material.

The circuit layer 14 (or a build-up layer) is disposed on the package body 12. The circuit layer 14 is electrically connected to the interconnection structure 11. The circuit layer 14 includes one or more interconnection layers (e.g., a conductive layer 14c1 and a conductive via 14v1) and one or more dielectric layers (e.g., dielectric layers 14d1, 10d2). In some embodiments, the conductive layer 14c1 may include a patterned conductive layer, such as a RDL. The conductive layer 14c1 is disposed on the dielectric layer 14d1 and covered by the dielectric layer 14d2. The conductive layer 14c1 is electrically connected to the conductive pins 11p by the conductive via 14v1. For example, the conductive via 14v1 penetrates the dielectric layer 14d1 and electrically connects the conductive layer 14c1 with the conductive pins 11p.

In some embodiments, each of the dielectric layers 14d1 and 14d2 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, each of the dielectric layers 14d1 and 14d2 may include an inorganic material, such as silicon, a ceramic or the like. The conductive layer 14c1 and the conductive via 14v1 may be or include a conductive material such as a metal or metal alloy. Examples of the conductive material include Au, Ag, Cu, Pt, Pd, other metal(s) or alloy(s), or a combination of two or more thereof. In some embodiments, there may be any number of conductive layers or dielectric layers depending on design specifications.

In some embodiments, the circuit layer 14 may be or include an antenna or an antenna package. The interconnection structure 11 may function as a feeding line of the antenna. To meet the requirements for designing the antenna with the better performance, the interconnection structure 11 (or the conductive pins 11p) may be high or tall enough (e.g., greater than 150 µm). In some embodiments, the feeding line can include conductive pillars formed by plating. However, due to the process limitation for forming the openings and plating, it is difficult to form the conductive pillars with the height greater than 150 µm, which would adversely affect the performance of the antenna.

In other embodiments, the feeding line can be formed by mounting conductive pillars on the conductive layer 10 using pick-and-place technique. However, the diameter of the conductive pillars should be larger than 200 µm for the pick-and-place operation, which would increase the area of the semiconductor device package. In addition, a tilt issue and a horizontal displacement may occur when the conductive pillars are placed on the conductive layer 10, which would adversely affect the performance of the antenna.

In accordance with the embodiments as shown in FIG. 1A, since the conductive pins 11p may be or include conductive wires (e.g., bonding wires) formed by wire-bond technique (the detailed operations will be described below), the conductive pins 11p may include a relatively greater height (e.g., greater than 150 μm) and a relatively less diameter (e.g., less than 200 μm), which can improve the performance of the antenna without increasing the area of the semiconductor device package 1.

Figure 2A:
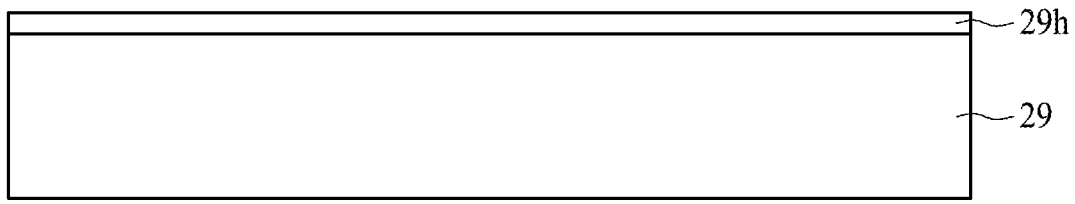
FIG. 2A, FIG. 2A', FIG. 2B, FIG. 2B', FIG. 2C, FIG. 2C', FIG. 2D, FIG. 2D', FIG. 2E, FIG. 2E', FIG. 2F, FIG. 2F', FIG. 2F" and FIG. 2F''' illustrate a method of manufacturing an interconnection structure, in accordance with some embodiments of the present disclosure.
Figure 2A:
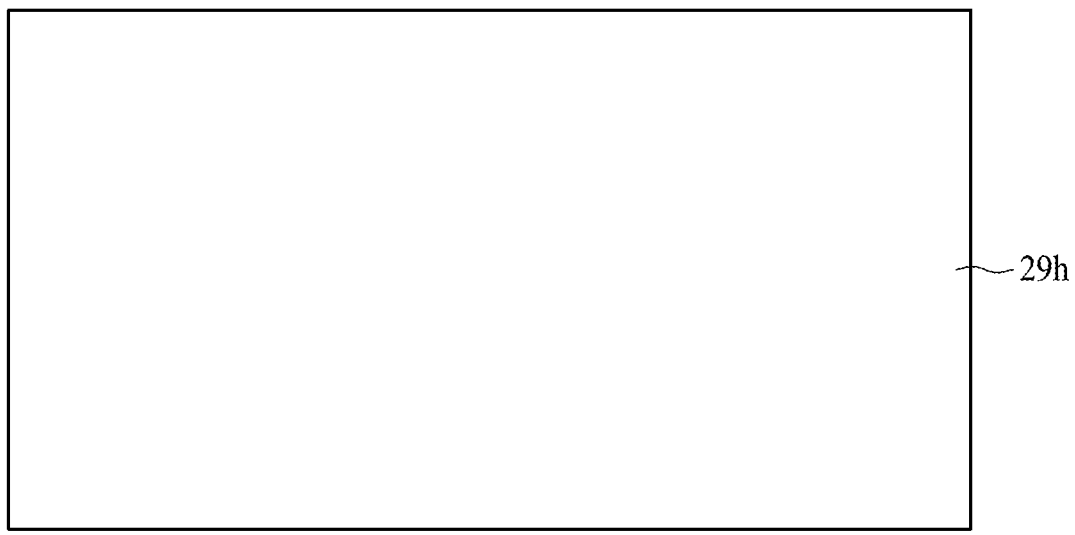
Figure 2B:
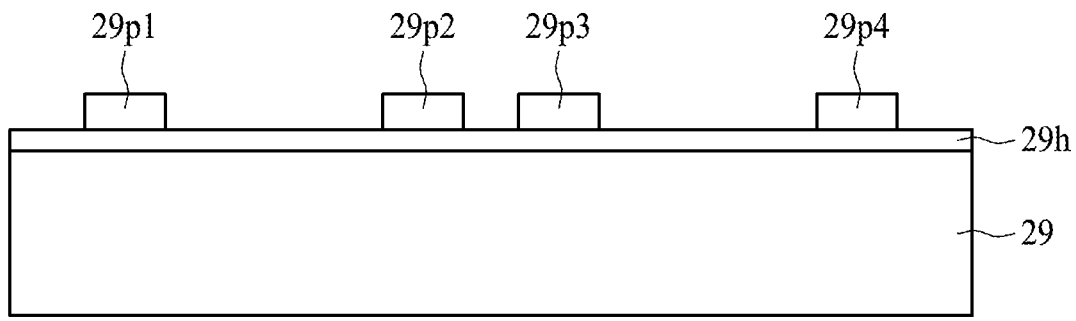
Figure 2B:
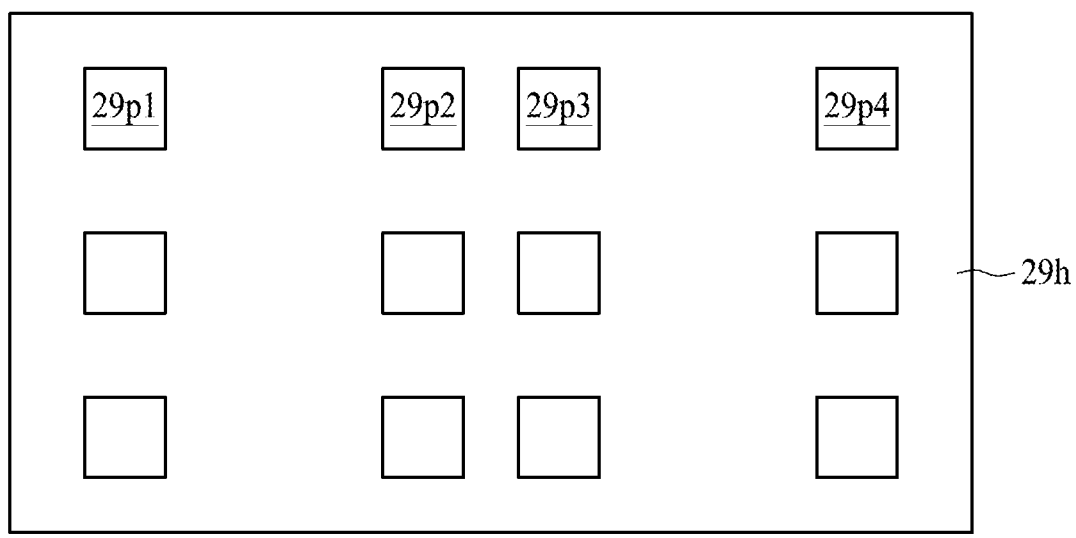
Figure 2C:
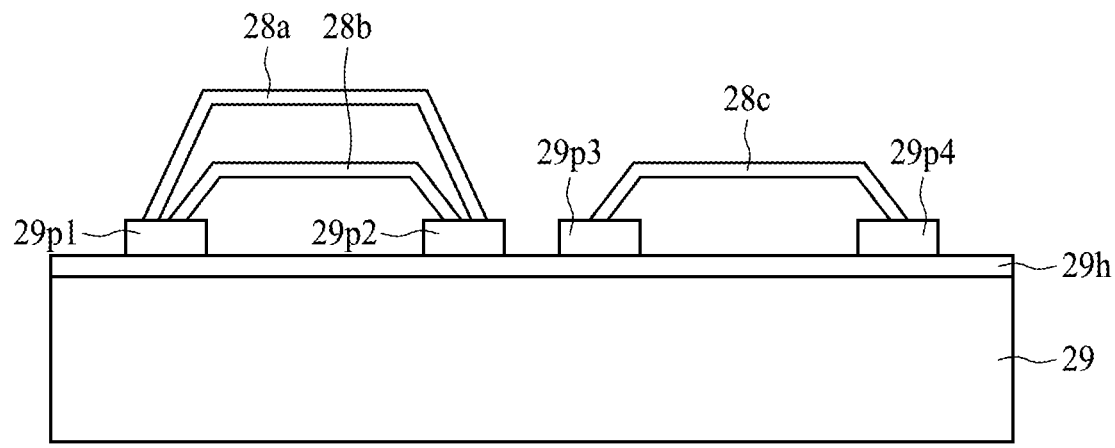
Figure 2C:
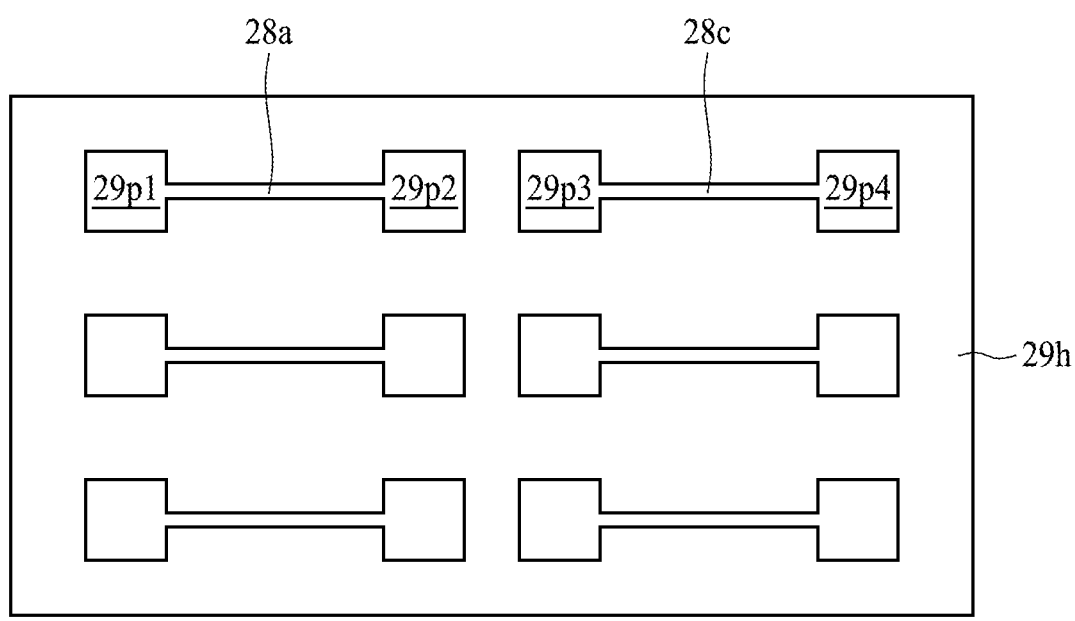
Figure 2D:
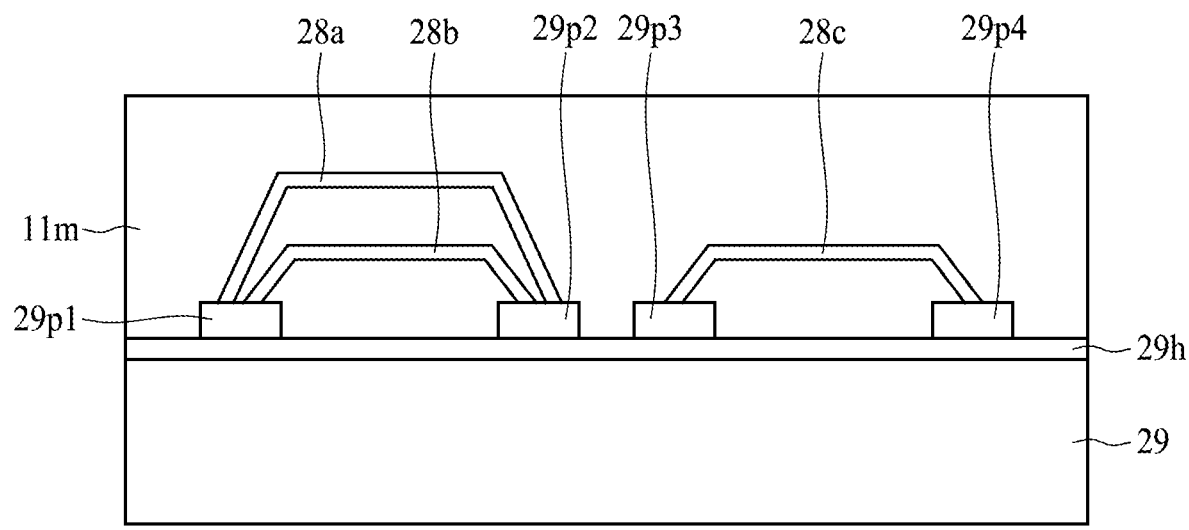
Figure 2D:
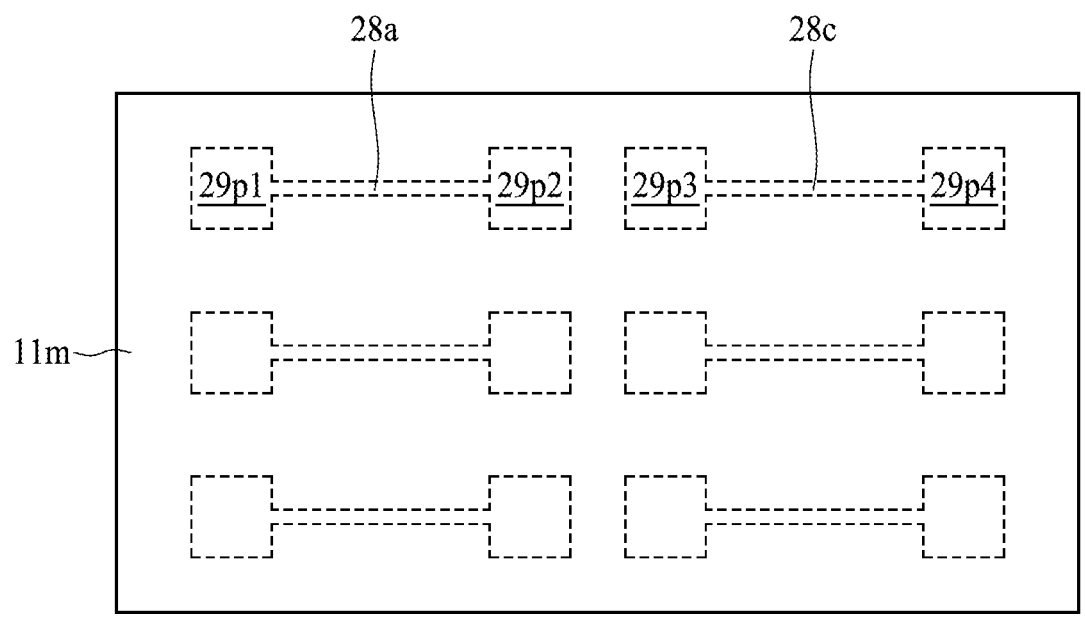
Figure 2E:
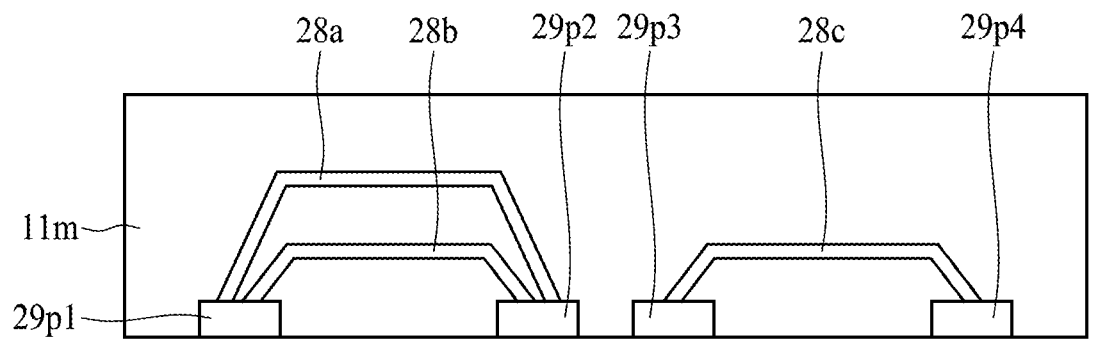
Figure 2E:
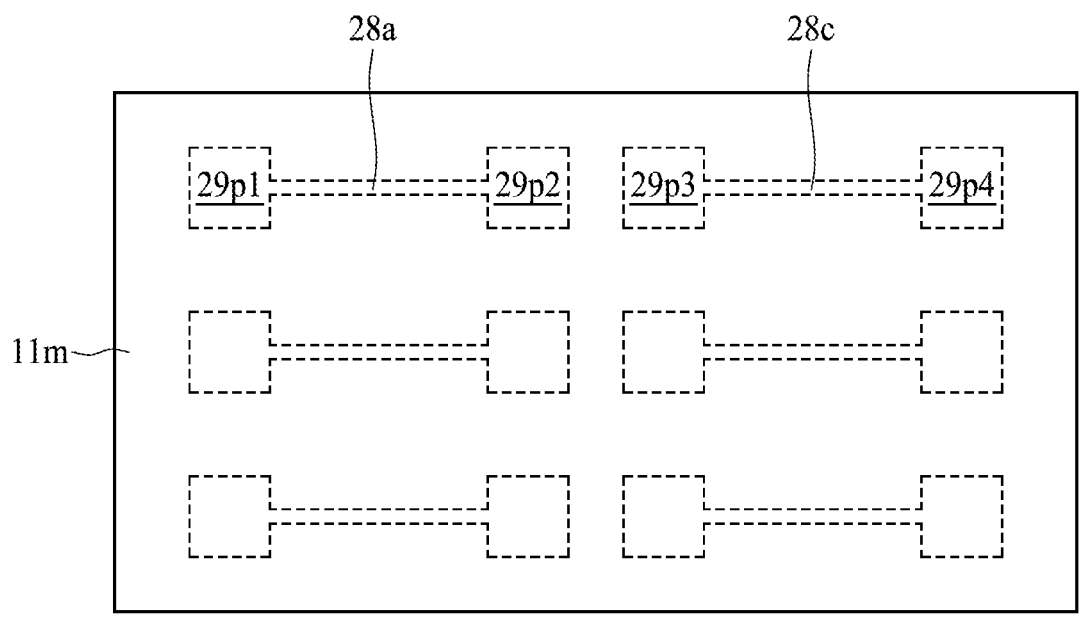
Figure 2F:
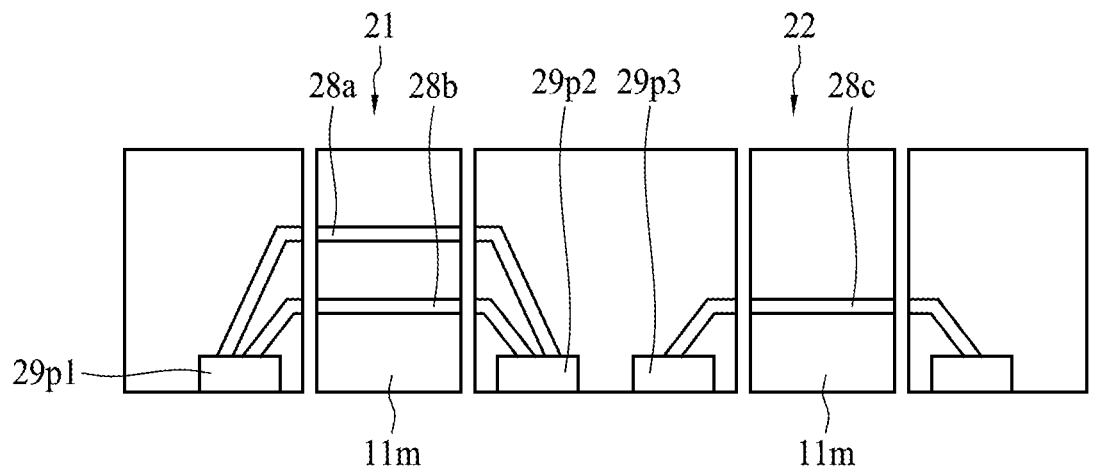
Figure 2F:
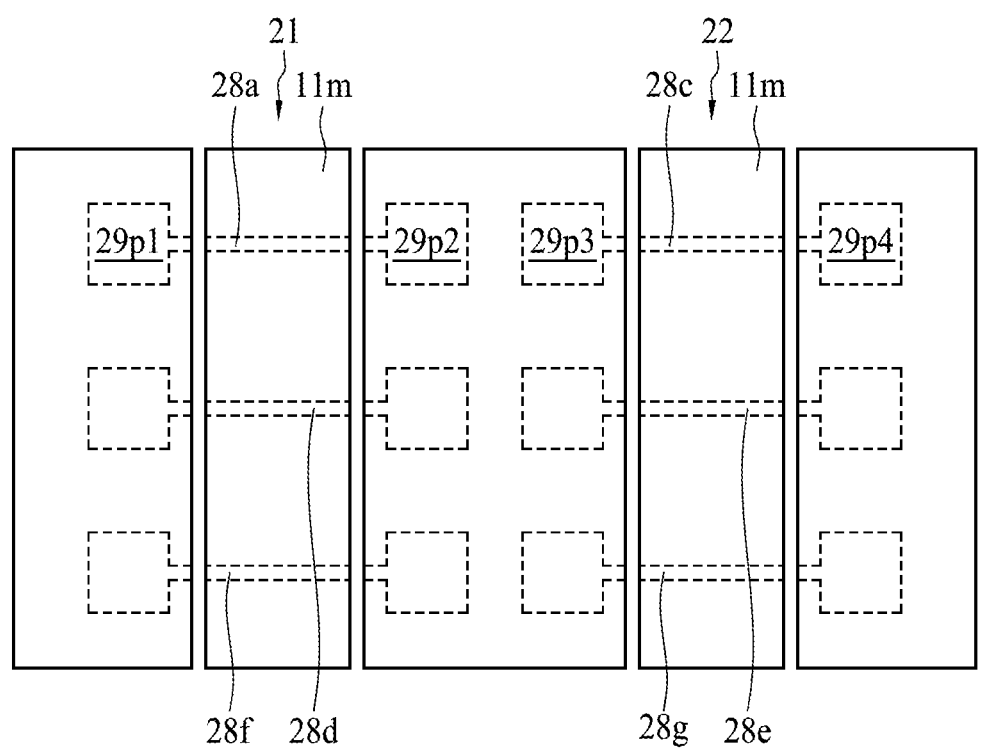

FIG. 2A, FIG. 2B, FIG. 2C, FIG. 2D, FIG. 2E and FIG. 2F illustrate a method of manufacturing an interconnection structure, in accordance with some embodiments of the present disclosure. FIG. 2A', FIG. 2B', FIG. 2C', FIG. 2D', FIG. 2E' and FIG. 2F' illustrate top views of the respective structures as illustrated in FIG. 2A, FIG. 2B, FIG. 2C, FIG. 2D, FIG. 2E and FIG. 2F, in accordance with some embodiments of the present disclosure. FIG. 2F" and FIG. 2F''' illustrate perspective views of the structures as shown in FIG. 2F and FIG. 2F', in accordance with some embodiments of the present disclosure.

Referring to FIG. 2A and FIG. 2A', a carrier 29 is provided. In some embodiments, the carrier 29 may include an adhesive layer 29h (e.g., a release layer) disposed thereon.

Referring to FIG. 2B and FIG. 2B', one or more conductive pads 29p1, 29p2, 29p3, 29p4 (e.g., patterned conductive layer, such as a RDL) are formed on the adhesive layer 29h. The conductive pads 29p1, 29p2, 29p3, 29p4 may be separated from each other. For example, the conductive pad 29p1 is spaced apart from the conductive pad 29p2. For example, the conductive pad 29p3 is spaced apart from the conductive pad 29p4.

Referring to FIG. 2C and FIG. 2C', conductive wires (or bonding wires) 28a, 28b, 28c are electrically connected to the conductive pads 29p1, 29p2, 29p3, 29p4. In some embodiments, the conductive wires 28a, 28b, 28c may be formed by wire-bonding technique or any other suitable operations. In some embodiments, each of the conductive wires 28a, 28b, 28c may be connected to two conductive pads. For example, the conductive wire 28a is electrically connected between the conductive pads 29p1 and 29p2. For example, the conductive wire 28b is electrically connected between the conductive pads 29p1 and 29p2. For example, the conductive wire 28c is electrically connected between the conductive pads 29p3 and 29p4.

In some embodiments, two or more conductive wires may be connected to the same conductive pads but have different elevations respect to the carrier 29. For example, as shown in FIG. 2C, both the conductive wires 28a and 28b are electrically connected between the conductive pads 29p1 and 29p2. The conductive wire 28a is over the conductive wire 28b. The elevation of the conductive wire 28a is greater than the elevation of the conductive wire 28b. The conductive wire 28a and the conductive wire 28b are overlapping from a top view as shown in FIG. 2C'.

Referring to FIG. 2D and FIG. 2D', a package body 11m is formed on the carrier 29 to cover the conductive pads 29p1, 29p2, 29p3, 29p4 and the conductive wires 28a, 28b, 28c. In some embodiments, the package body 11m can be formed by transferring molding, compression molding or any other suitable techniques.

Referring to FIG. 2E and FIG. 2E', the carrier 29 and the adhesive layer 29h are removed from the package body 11m. A portion of the conductive pads 29p1, 29p2, 29p3, 29p4 is exposed from the package body 11m.

Referring to FIG. 2F, FIG. 2F', FIG. 2F" and FIG. 2F''', singulation may be carried out to separate (or divide) the structure as shown in FIG. 2E and FIG. 2F' to form interconnection structures 21 and 22. For example, the singulation may be carried out through the package body 11m and a portion of the conductive wires 28a, 28b, 28c, 28d, 28e, 28f and 28g. For example, the singulation may be carried out through the horizontal portion of the conductive wires 28a, 28b, 28c, 28d, 28e, 28f and 28g. In some embodiments, the singulation may be carried out by, for example, cutting or any other suitable processes. In some embodiments, the interconnection structures 21 and 22 are the same or similar to the interconnection structure 11 as shown in FIG. 1A, and the descriptions for the interconnection structure 11 are applicable to the interconnection structures 21 and 22.

Since the conductive wires 28a, 28b, 28c, 28d, 28e, 28f and 28g are formed by wire-bonding technique, the conductive wires 28a, 28b, 28c, 28d, 28e, 28f and 28g can have a relative long length (e.g., greater than 1 mm) with a relative thin thickness (e.g., less than 10 μm) compared with conductive pillars formed by plating. In addition, since the locations of the conductive pads 29p1, 29p2, 29p3 and 29p4 can be determined based on the design requirements, it is easier to form an interconnection structure having various lengths of the conductive wires. Compared with plating conductive pillars (which cannot have different heights on a carrier in a single process), using conductive wires can increase the flexibility for design the interconnection structure.

Figure 3A:
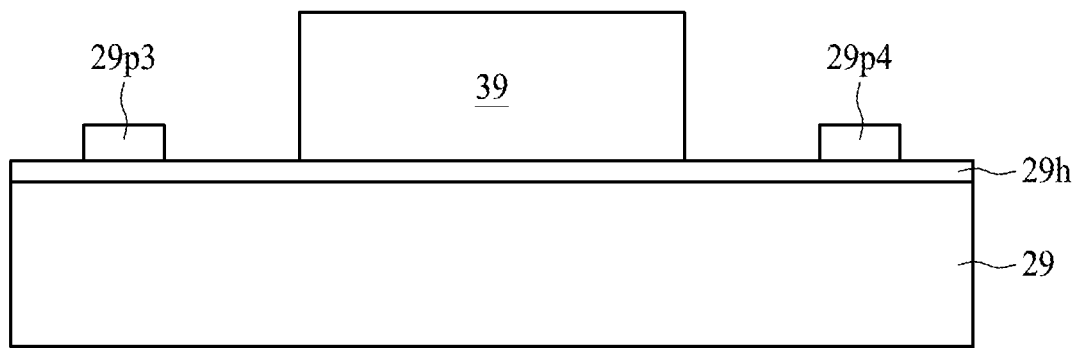
FIG. 3A, FIG. 3B, FIG. 3B', FIG. 3C, FIG. 3D, FIG. 3D'.
Figure 3B:
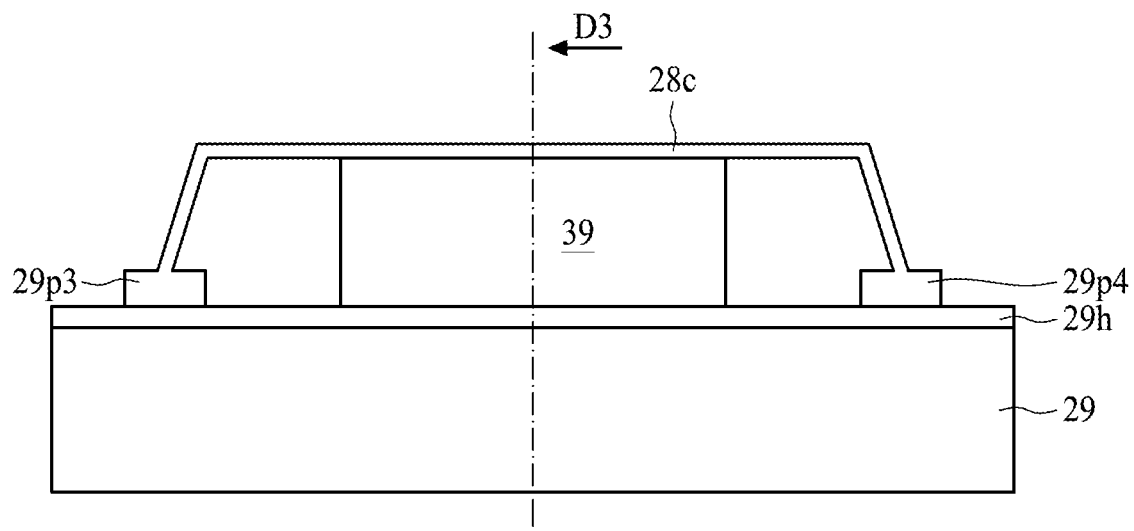
Figure 3B:
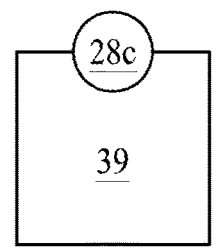
Figure 3C:
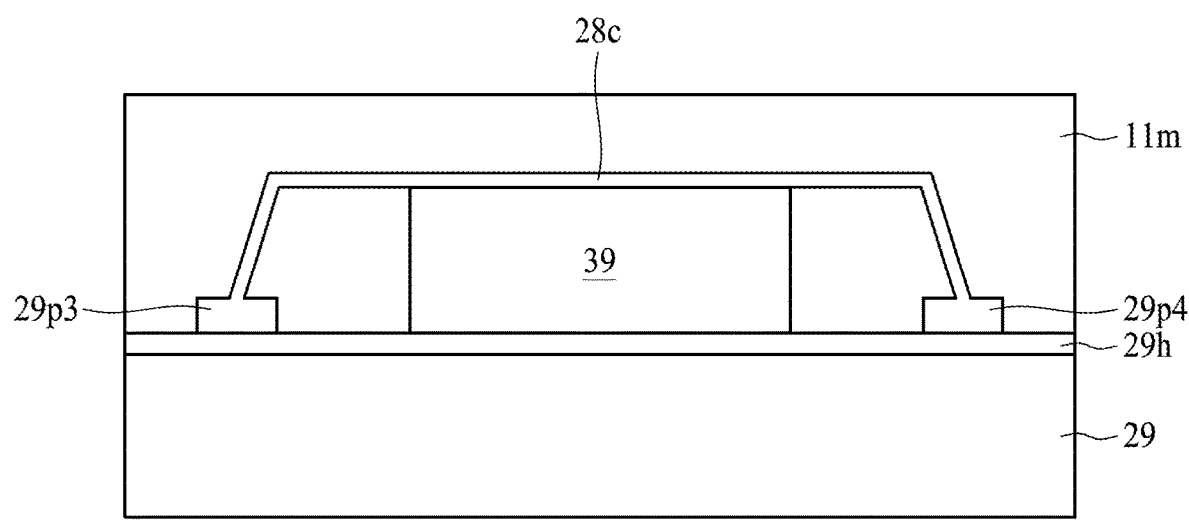
FIG. 3E and FIG. 3F illustrate a method of manufacturing an interconnection structure, in accordance with some embodiments of the present disclosure.
Figure 3D:
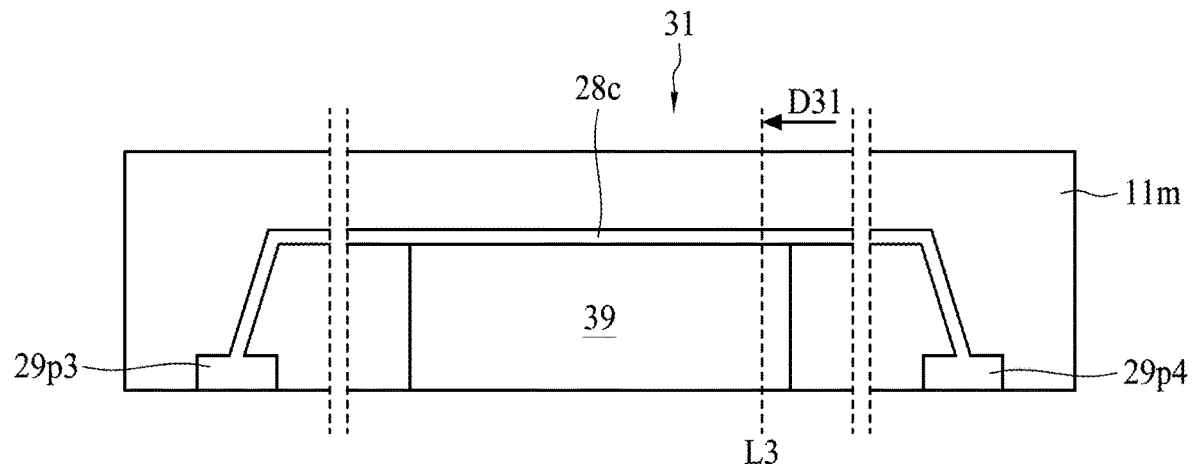
Figure 3D:
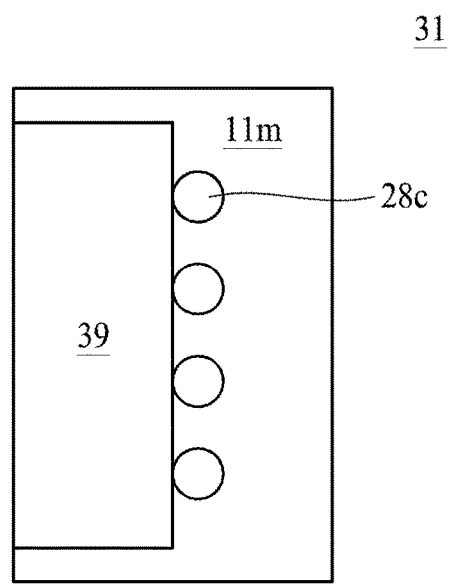
Figure 3E:
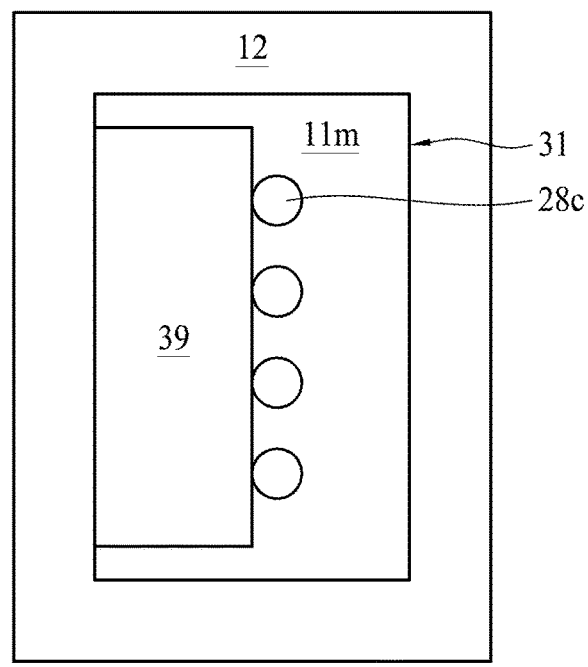
Figure 3F:
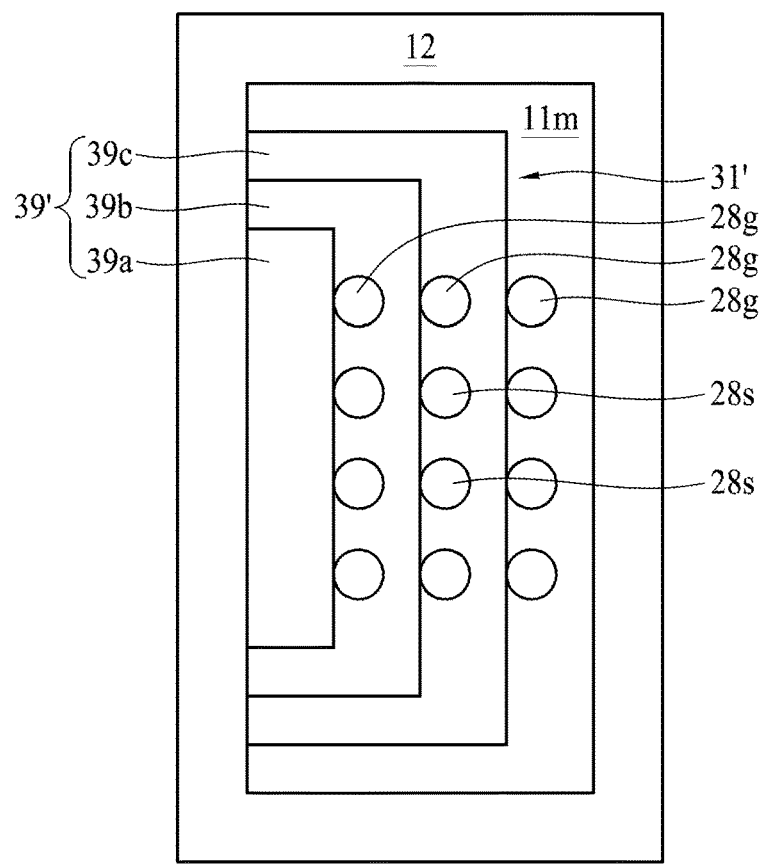

FIG. 3A, FIG. 3B, FIG. 3B', FIG. 3C, FIG. 3D, FIG. 3D', FIG. 3E and FIG. 3F illustrate a method of manufacturing an interconnection structure, in accordance with some embodiments of the present disclosure. The operations illustrated in FIG. 3A, FIG. 3B, FIG. 3B', FIG. 3C, FIG. 3D, FIG. 3D', FIG. 3E and FIG. 3F are similar to parts of the operations as illustrated in FIG. 2A, FIG. 2B, FIG. 2C, FIG. 2D, FIG. 2E and FIG. 2F, and some of the differences therebetween are described below.

Referring to FIG. 3A, prior to the formation of the conductive wire 28c, a support structure 39 is disposed on the carrier 29. The support structure 39 is disposed between the conductive pads 29p3 and 29p4. In some embodiments, the support structure 39 is or includes a package body. The support structure 39 and the package body 11m may include the same material. Alternatively, the support structure 39 and the package body 11m may include different materials.

Referring to FIG. 3B, the conductive wire 28c is formed across the support structure 39 to electrically connect the conductive pad 29p3 with the conductive pad 29p4. The conductive wire 28c is in contact with a top surface of the support structure 39. The support structure 39 can be used to support the conductive wire 28c, which can prevent the conductive wire 28c having a relatively long length from being bended or curved.

In some embodiments, as shown in FIG. 3B', which illustrates a cross-sectional view of the structure as shown in FIG. 3B from the direction D3, a portion of the conductive wire 28c may be embedded into the support structure 39. For example, the support structure 39 may have a trench on its top surface to accommodate a portion of the conductive wire 28c. The trench of the support structure 39 can be used to prevent the displacement of the conductive wire 28c during the manufacturing processes.

Referring to FIG. 3C, the package body 11m is formed to cover the conductive wire 28c, the conductive pads 29p3, 29p4 and the support structure 39. In some embodiments, if the support structure 39 has the trench to accommodate a portion of the conductive wire 28c as shown in FIG. 3B', the conductive wire 28c would be covered by both the support structure 39 and the package body 11m. For example, an upper portion of the conductive wire 28c is covered by and in contact with the package body 11m while a lower portion of the conductive wire 28c is covered by and in contact with the support structure 39. The carrier 29 and the adhesive layer 29h are then removed from the package body 11m to expose a portion of the conductive pads 29p3, 29p4 and the package body 11m.

Referring to FIG. 3D, singulation may be carried out to separate (or divide) the structure as shown in FIG. 3C to form an interconnection structure 31. For example, the singulation may be carried out through the package body 11m and a portion of the conductive wire 28c. In some embodiments, the singulation may be carried out by, for example, cutting or any other suitable processes. In some embodiments, the interconnection structure 31 is the same or similar to the interconnection structure 11 as shown in FIG. 1A, and the descriptions for the interconnection structure 11 are applicable to the interconnection structure 31.

FIG. 3D' illustrates a cross-sectional view of the interconnection structure 31 cutting through the dotted-line L3 along a direction D31, in accordance with some embodiments of the present disclosure. As shown in FIG. 3D, the conductive wire 28c is in contact with the support structure 39, and the package body 11m covers and is in contact with the conductive wire 28c and a portion of the support structure 39. For example, the package body 11m covers a top surface of the support structure 39 on which the conductive wire 28c is disposed and two opposite lateral surfaces substantially perpendicular to the top surface. A bottom surface of the support structure 39 opposite to the top surface is exposed from the package body 11m.

Referring to FIG. 3E, the interconnection structure 31 as shown in FIG. 3D and FIG. 3D' can be disposed on the conductive layer 10 and covered by the package body 12 as shown in FIG. 1A. As shown in FIG. 3E, the package body covers and is in contact with the package body 11m and the support structure 39.

FIG. 3F illustrates a cross-sectional view of the interconnection structure 31' covered by the package body 12, in accordance with some embodiments of the present disclosure. The structure illustrated in FIG. 3F is similar to the structure illustrated in FIG. 3E, and the differences therebetween are described below.

The interconnection structure 31' has a multi-layer support structure 39'. For example, the support structure 39' may include layers 39a, 39b and 39c. In some embodiments, the layers 39a, 39b and 39c of the support structure 39' may include different heights (or the thicknesses). Conductive wires 28g and 28s can be disposed on the layers 39a, 39b and 39c of the support structure 39' to achieve multi-column conductive vias. In some embodiments, the conductive wires 28s are configured to transmit signal while the conductive wires 28g surrounding the conductive wires 28s are connected to ground. The conductive wires 28g can provide shielding for the conductive wires 28s, which can prevent the signal transmitted through the conductive wires 28s from being interfered.

Figure 4A:
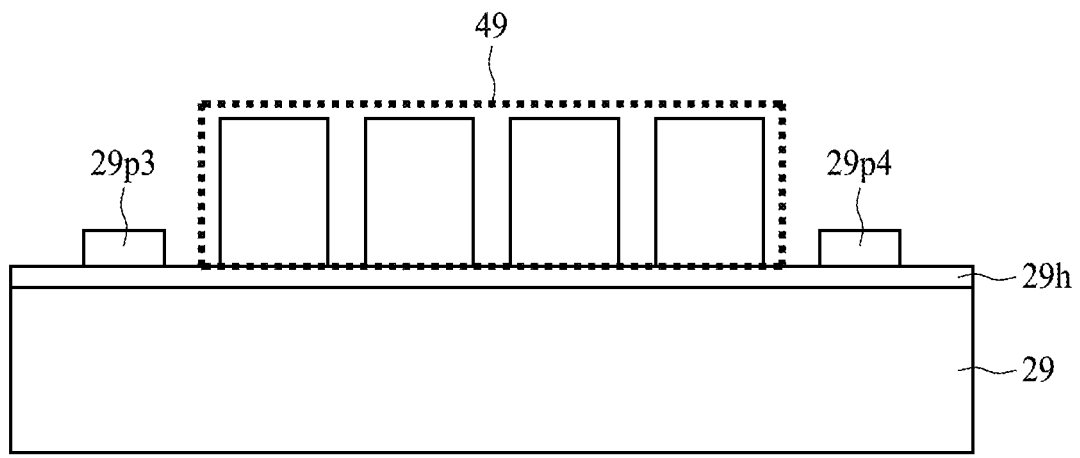
FIG. 4A, FIG. 4B and FIG. 4C illustrate a method of manufacturing an interconnection structure, in accordance with some embodiments of the present disclosure.
Figure 4B:
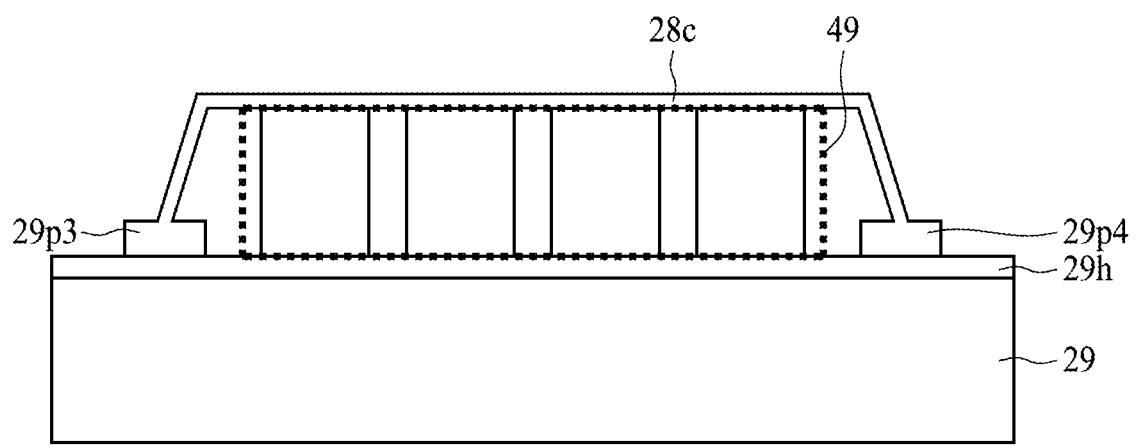
Figure 4C:
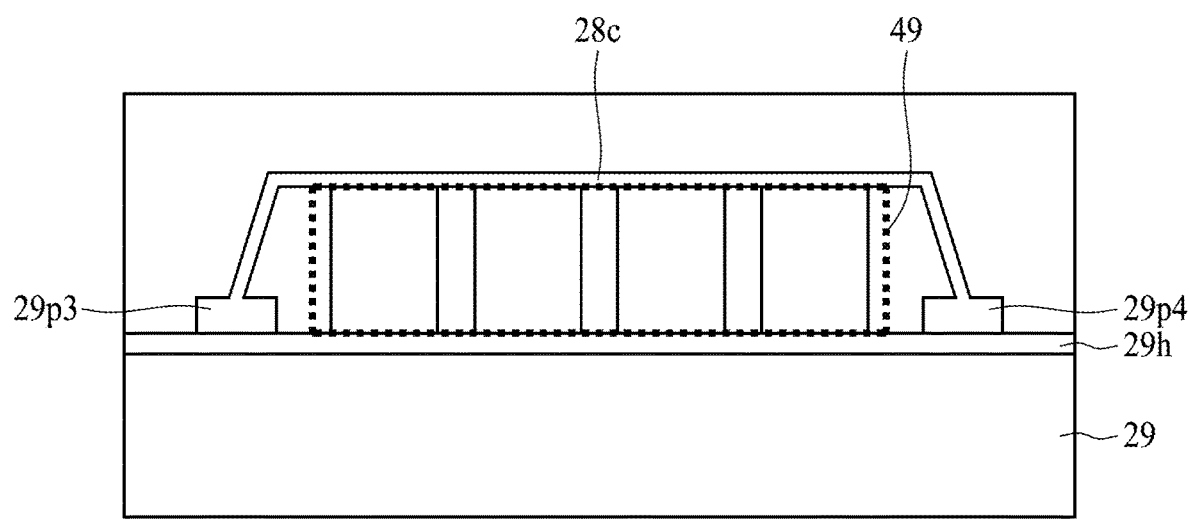

FIG. 4A, FIG. 4B and FIG. 4C illustrate cross-sectional views of a semiconductor manufacturing method, in accordance with some embodiments of the present disclosure. The operations illustrated in FIG. 4A, FIG. 4B and FIG. 4C are similar to those as illustrated in FIG. 3A, FIG. 3B and FIG. 3C, except that the support structure 49 include many pieces. The pieces of the support structure 49 are spaced apart from each other. For example, there is a gap or a distance between two adjacent pieces of the support structure 49. Hence, as shown in FIG. 4C, after the formation of the package body 11m, the package body 11m would be disposed within the gap between two adjacent pieces of the support structure 49.

FIG. 5A, FIG. 5B, FIG. 5C, FIG. 5D, FIG. 5E, FIG. 5F, FIG. 5G, FIG. 5H, FIG. 5I and FIG. 5J illustrate cross-sectional views of a semiconductor manufacturing method, in accordance with some embodiments of the present disclosure. In some embodiments, the operations illustrated in FIG. 5A, FIG. 5B, FIG. 5C, FIG. 5D, FIG. 5E, FIG. 5F, FIG. 5G, FIG. 5H, FIG. 5I and FIG. 5J can be used to manufacture the semiconductor device package as shown in FIG. 1A.

Figure 5A:
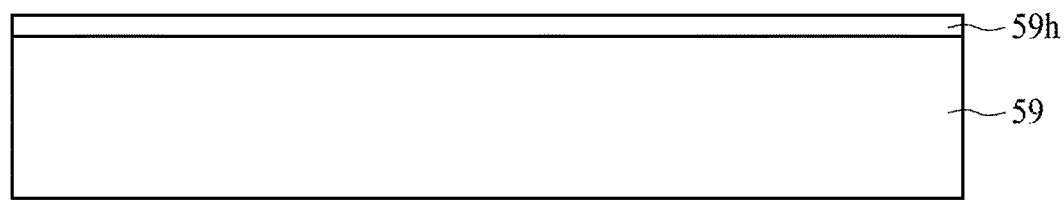
FIG. 5A, FIG. 5B, FIG. 5C, FIG. 5D, FIG. 5E, FIG. 5F, FIG. 5G, FIG. 5H, FIG. 5I and FIG. 5J illustrate a method of manufacturing a semiconductor device package, in accordance with some embodiments of the present disclosure.

Referring to FIG. 5A, a carrier 59 is provided. In some embodiments, the carrier 59 may include an adhesive layer 59h (e.g., a release layer) disposed thereon.

Figure 5B:
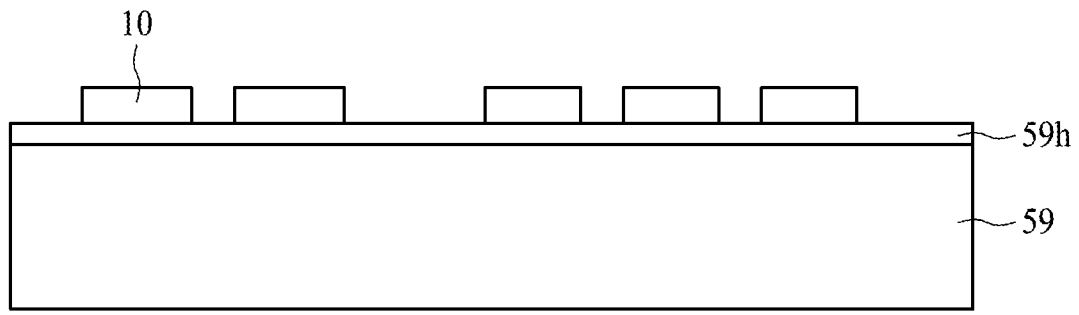

Referring to FIG. 5B, a conductive layer 10 is formed on the carrier 59 (or the adhesive layer 59h). In some embodiments, the conductive layer 10 includes a patterned conductive layer, such as a RDL.

Figure 5C:
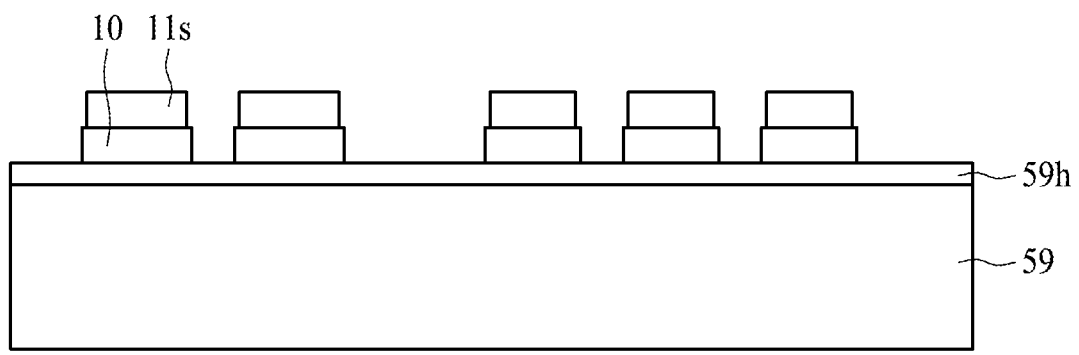

Referring to FIG. 5C, electrical contacts 11s (e.g., solder pastes) are formed on the conductive layer 10. In some embodiments, the electrical contacts 11s are formed by, for example, printing or any other suitable techniques.

Figure 5D:
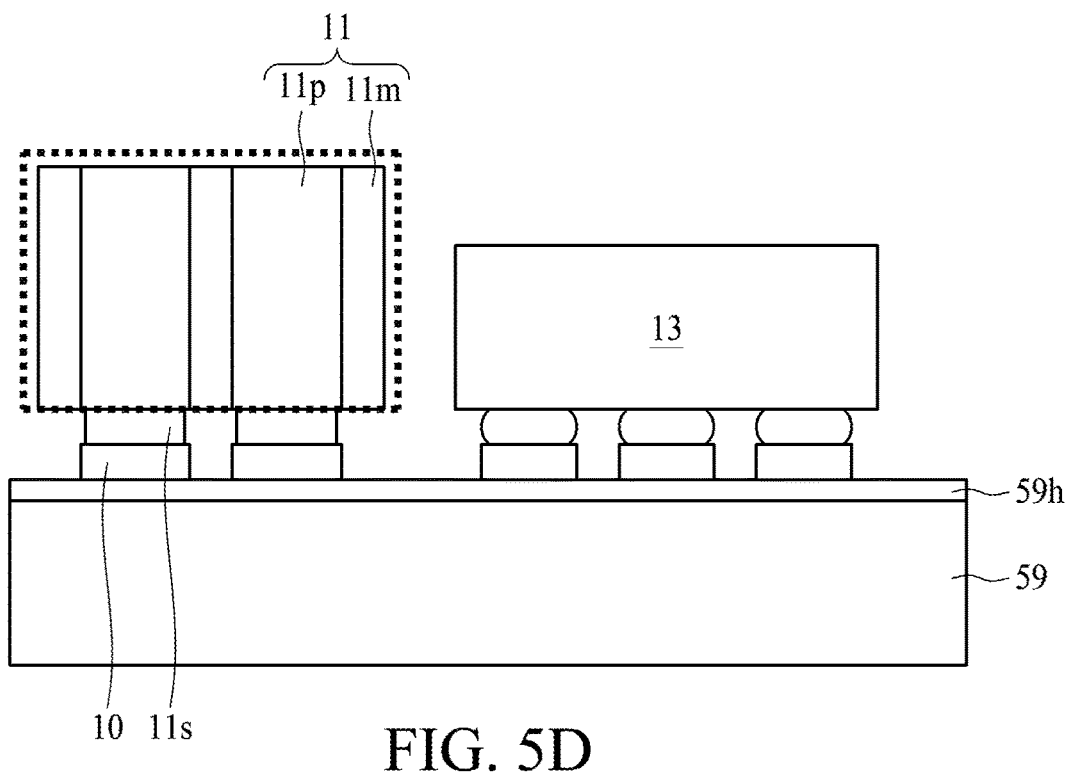

Referring to FIG. 5D, the interconnection structure 11 is disposed (or mounted) on the conductive layer 10 and electrically connected to the conductive layer 10 through the electrical contacts 11s. For example, a portion (e.g., a bottom surface) of the conductive pins 11p exposed from the package body 11m is electrically connected with and in contact with the electrical contracts 11s. In some embodiments, the interconnection structure 11 can be formed by the operations as shown in any of FIGS. 2A-2F, FIGS. 3A-3C and FIGS. 4A-4C. An electronic component 13 is connected to the conductive layer 10 through, for example, flip-chip or wire-bond techniques.

Figure 5E:
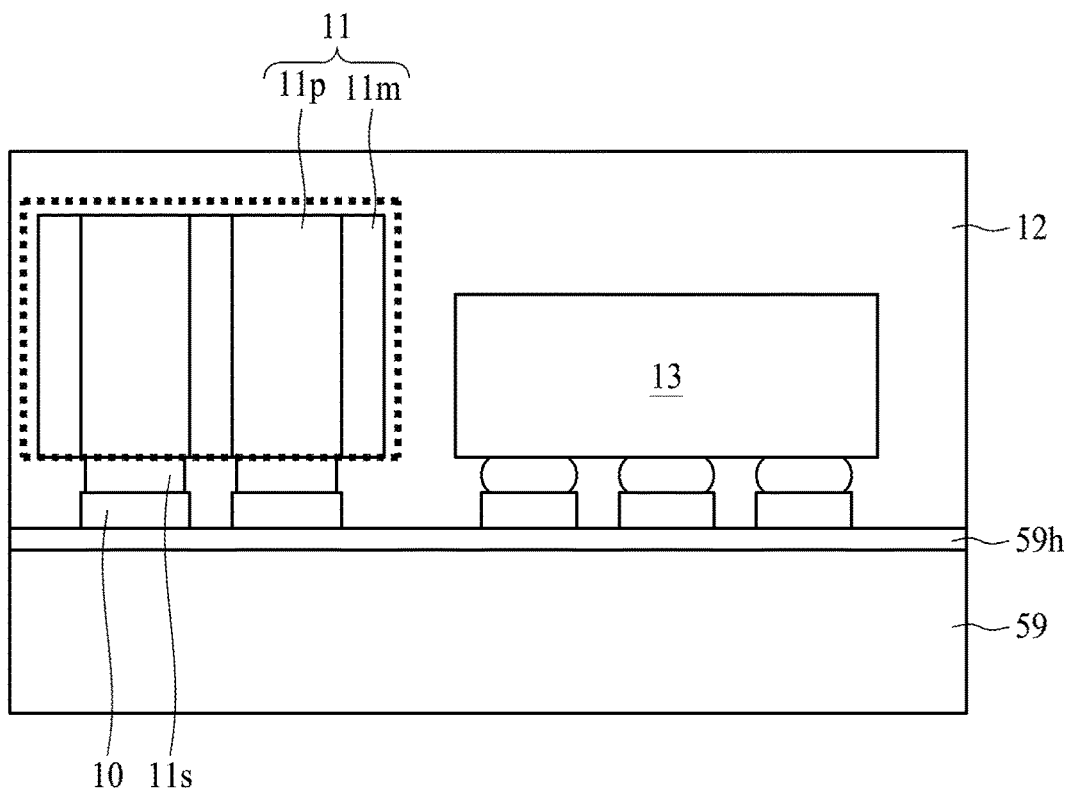

Referring to FIG. 5E, a package body 12 is formed on the carrier 59 (or the adhesive layer 59h) to cover the interconnection structure 11, the electronic component 13, the electrical contacts 11s and the conductive layer 10. In some embodiments, the package body 12 can be formed by transferring molding, compression molding or any other suitable techniques.

Figure 5F:
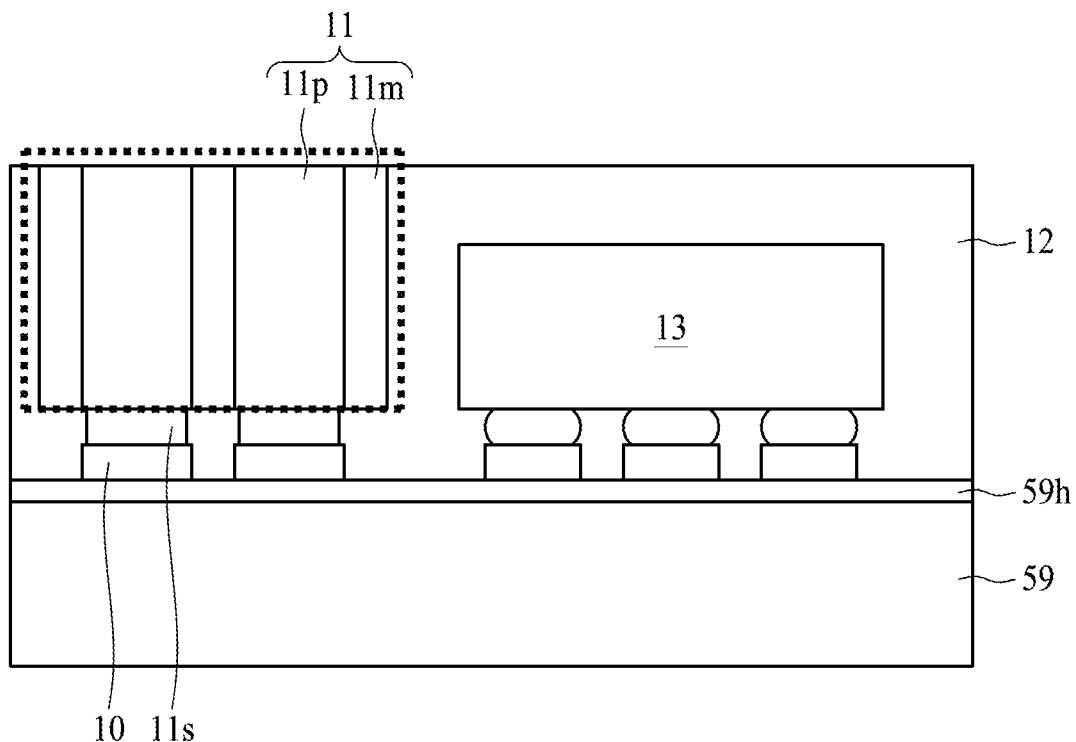

In some embodiments, the package body 12 may fully cover the interconnection structure 11 and the electronic component 13. A portion of the package body 12 is then removed to expose a portion of the interconnection structure 11 (e.g., a top portion of the conductive pins 11p) as shown in FIG. 5F. In some embodiments, the portion of the package body 12 may be removed by grinding or any other suitable operations.

Figure 5G:
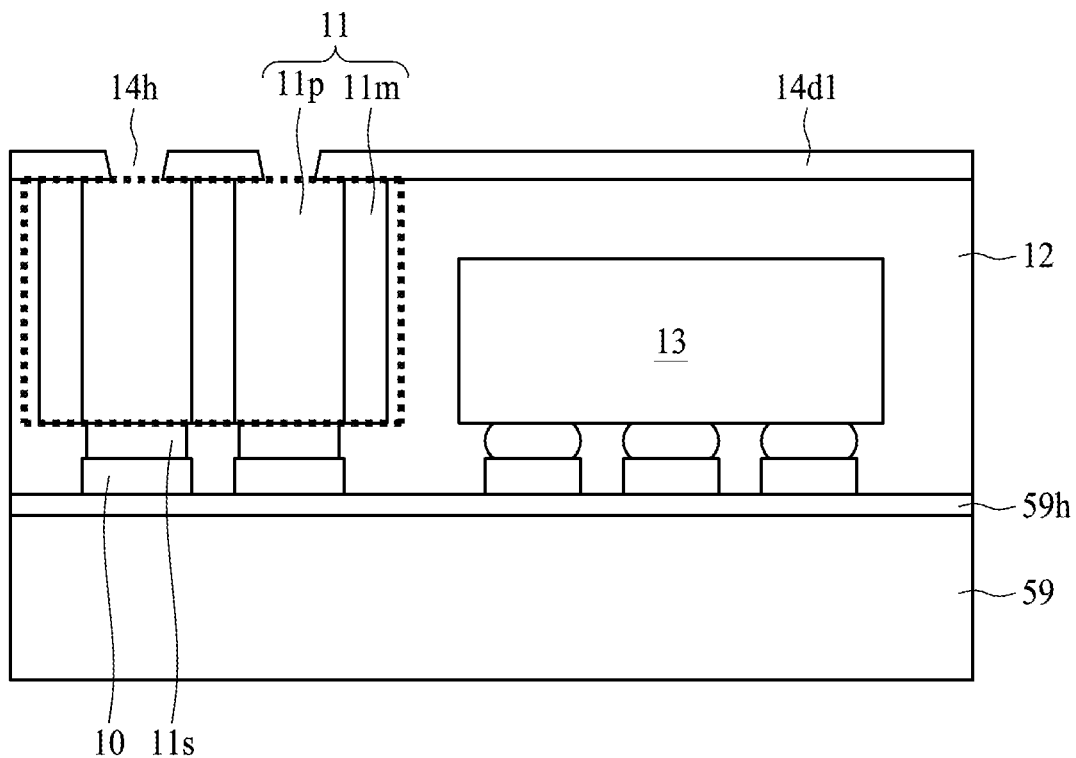

Referring to FIG. 5G, a dielectric layer 14d1 is formed on the package body 12. One or more openings 14h are formed to penetrate the dielectric layer 14d1 to expose a portion (e.g., the top surface) of the conductive pins 11p.

Figure 5H:
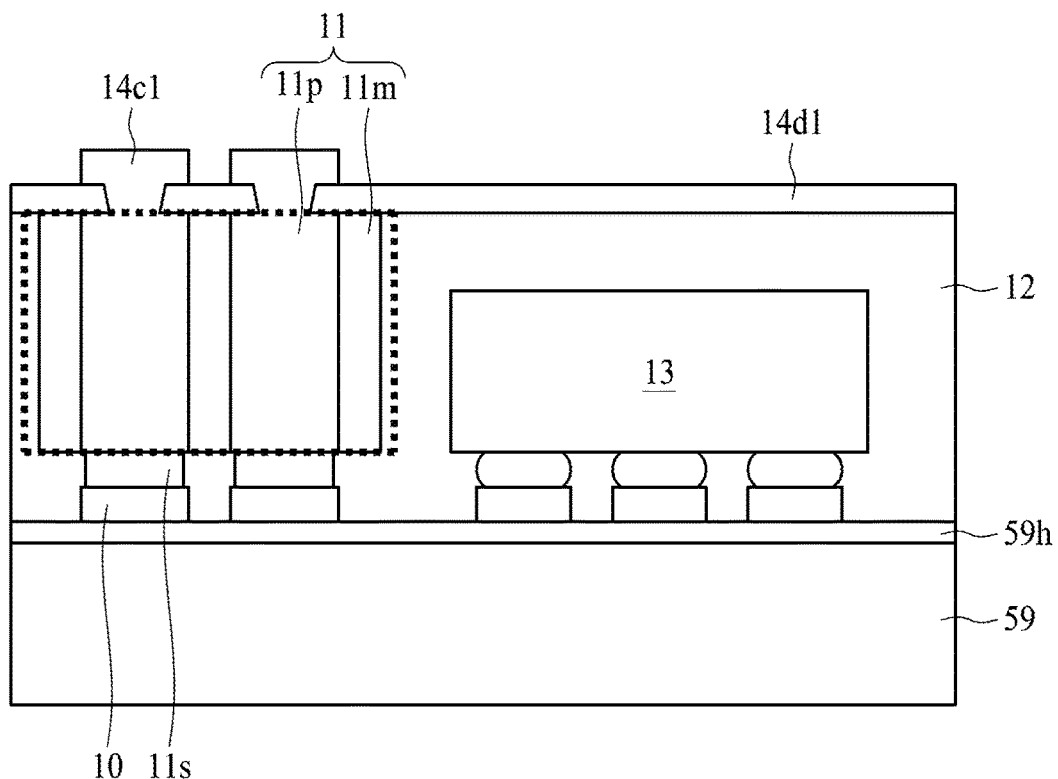

Referring to FIG. 5H, a conductive layer 14c1 is formed on the dielectric layer 14d1 and within the openings 14h to be electrically connected to the conductive pins 11p. In some embodiments, the conductive layer 14c1 includes a patterned conductive layer, such as a RDL.

Figure 5I:
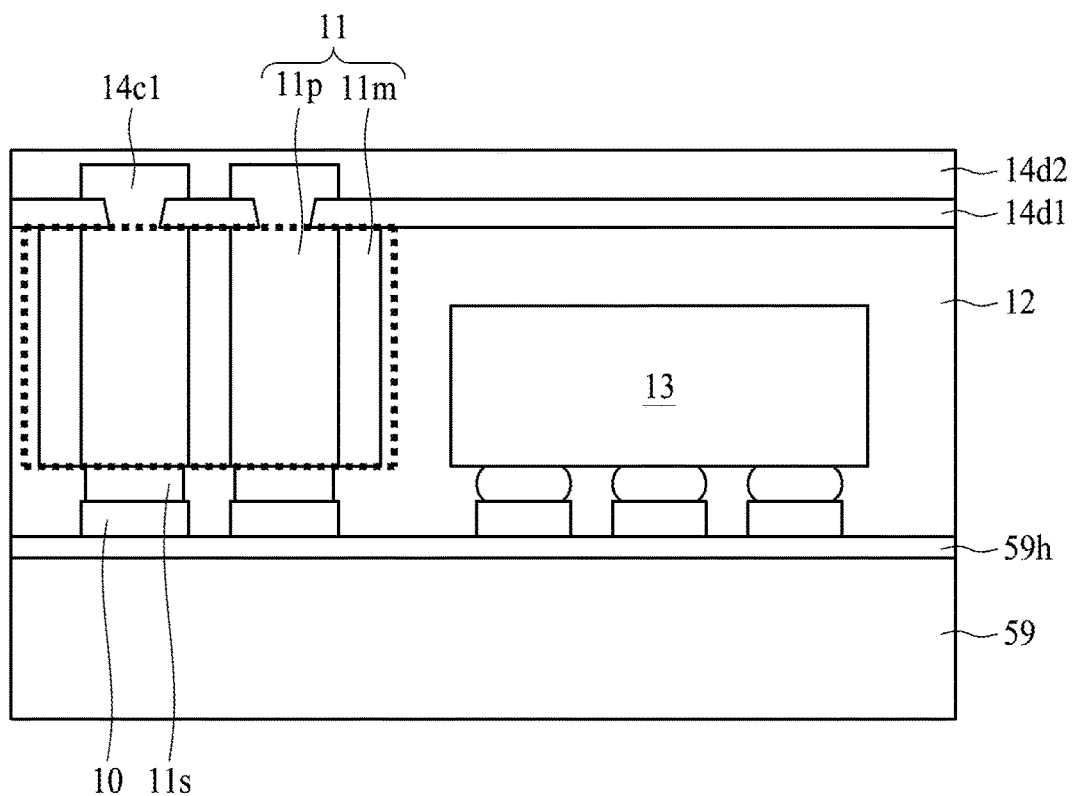

Referring to FIG. 5I, a dielectric layer 14d2 is formed on the dielectric layer 14d1 and covers the conductive layer 14c1. The dielectric layer 14d2 may function as a projection layer to prevent oxidation of the conductive layer 14c1.

Figure 5J:
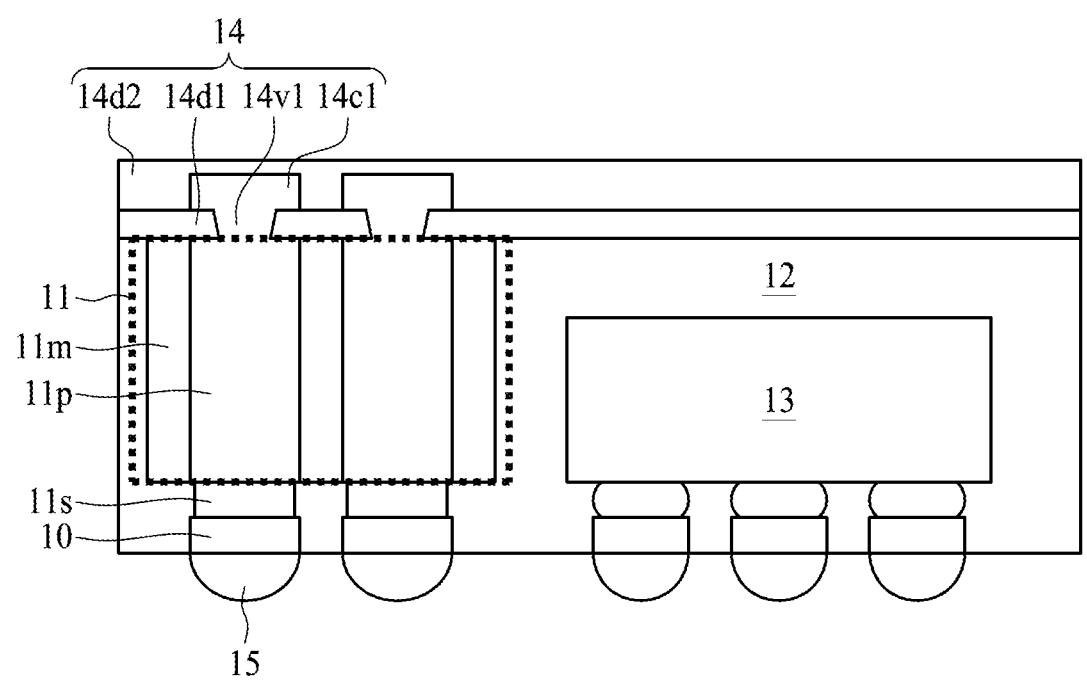

Referring to FIG. 5J, the carrier 59 and the adhesive layer 59h are removed (or de-bonded) from the package body 12 to expose a portion (e.g., a bottom surface) of the conductive layer 10. Electrical contacts 15 (e.g., solder balls) are then formed on the exposed portion of the conductive layer 10.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An antenna package, comprising:
    a conductive layer;
    an interconnection structure disposed on the conductive layer, the interconnection structure comprising:
        a conductive via having a first surface facing the conductive layer, a second surface opposite to the first surface and a lateral surface extending from the first surface to the second surface; and
        a first package body covering the lateral surface of the conductive via and exposing the first surface and the second surface of the conductive via, wherein the first package body is spaced apart from the conductive layer; and
    an antenna electrically connected to the second surface of the conductive via,
    wherein the interconnection structure further comprises a support structure in contact with a portion of the lateral surface of the conductive via, wherein the first package body covers the support structure, and the antenna further comprises a second package body in contact with the first package body and the support structure, and wherein the support structure has a plurality of segments separated from each other, and wherein the first package body is disposed between two adjacent segments.

2. The antenna package of claim 1, wherein the support structure includes a plurality of layers, wherein the interconnection structure includes a plurality of conductive vias each having a lateral surface in contact with the corresponding layers of the support structure.

3. The antenna package of claim 1, further comprising an electrical contact electrically connecting the conductive layer with the first surface of the conductive via.

4. The antenna package of claim 1, wherein the conductive via is configured to function as a feeding line of the antenna.

5. The antenna package of claim 1, wherein the conductive via is a portion of a bonding wire.

6. The antenna package of claim 1, wherein the portion of the lateral surface of the conductive via is embedded within the support structure, and wherein the rest portion of the lateral surface of the conductive via is in contact with the first package body.

7. A method of manufacturing an interconnection structure, comprising:
    (a) providing a carrier;
    (b) forming a first conductive element and a second conductive element on the carrier, the first conductive element and the second conductive element include different elevations with respect to the carrier, wherein the first conductive element is formed by connecting a first bonding wire between a first conductive pad and a second conductive pad on the carrier, and the second conductive element is formed by connecting a second bonding wire between a third conductive pad and a fourth conductive pad on the carrier;

(c) forming a dielectric layer on the carrier and covering the first conductive element and the second conductive element; and (d) removing the first conductive pad, the second conductive pad, the third conductive pad, the fourth conductive pad, a portion of the first bonding wire and a portion of the second boding wire.

8. The antenna package of claim 3, wherein the second package body encapsulates the interconnection structure, the electrical contact and the conductive layer.

9. The antenna package of claim 8, wherein a dielectric constant (Dk) of the first package body is lower than a Dk of the second package body.

10. The antenna package of claim 8, wherein a coefficient of thermal expansion (CTE) of the first package body is lower than a CTE of the second package body.

11. The antenna package of claim 8, wherein the antenna comprises:
   a dielectric layer disposed on the interconnection structure and exposing the second surface of the conductive via; and
   an antenna pattern disposed on the dielectric layer and extended to the exposed second surface of the conductive via.

12. The antenna package of claim 11, wherein the dielectric layer covers the second package body.

* * * * *